United States Patent
Müller-Rissmann et al.

(10) Patent No.: US 6,521,877 B1
(45) Date of Patent: Feb. 18, 2003

(54) OPTICAL ARRANGEMENT HAVING IMPROVED TEMPERATURE DISTRIBUTION WITHIN AN OPTICAL ELEMENT

(75) Inventors: Werner Müller-Rissmann, Oberkochen (DE); Hubert Holderer, Königsbronn (DE); Rudolf Von Bünau, Esslingen (DE); Christian Wagner, Aalen (DE); Jochen Becker, Oberkochen (DE); Stefan Xalter, Oberkochen (DE); Wolfgang Hummel, Schwäbisch Gmünd (DE)

(73) Assignee: Carl-Zeiss-Stiftung (DE)

( * ) Notice: Subject to any disclaimer, the term of this patent is extended or adjusted under 35 U.S.C. 154(b) by 84 days.

(21) Appl. No.: 09/721,451

(22) Filed: Nov. 22, 2000

(30) Foreign Application Priority Data

Nov. 24, 1999 (DE) .......................... 199 56 353

(51) Int. Cl.[7] ................................. G01J 1/20
(52) U.S. Cl. .................... 250/201.1; 250/216; 359/290; 359/820
(58) Field of Search .............................. 250/201.1, 216, 250/548; 359/290, 291, 820; 355/67, 30

(56) References Cited

U.S. PATENT DOCUMENTS 5,805,273 A * 9/1998 Unno ..................... 355/30

5,883,704 A 3/1999 Nishi et al.

FOREIGN PATENT DOCUMENTS

| DE | A 198 07 094 | 8/1999 |
| DE | A 198 27 602 | 12/1999 |
| EP | B 0 532 236 | 7/1997 |

* cited by examiner

Primary Examiner—Stephone B. Allen
Assistant Examiner—Bradford Hill
(74) Attorney, Agent, or Firm—Factor & Partners

(57) ABSTRACT

An optical arrangement, in particular a microlithographic projection printing installation, has in particular a slot-shaped image field or rotationally non-symmetrical illumination. A refractive optical element, e.g. a lens (2), is heated by the rotationally non-symmetrical radiated impingement (3) of a light source. At least one electric heating element is coupled to the optical element. Said heating element comprises a resistance heating coating carried by the optical element. In the region of the surface (3) of the optical element acted upon by the radiation of the light source the resistance heating coating is substantially optically transparent. It comprises a plurality of parallel, electrically mutually insulated coating strips (5 to 10). A heating current source (17 to 19) is additionally part of the heating element. By virtue of the combined heating of the optical element by the radiated impingement (3) and the resistance heating, a correction of imaging defects induced by illumination in the optical element is achieved by means of a symmetrical and/or homogeneous temperature and refractive index distribution.

17 Claims, 1 Drawing Sheet

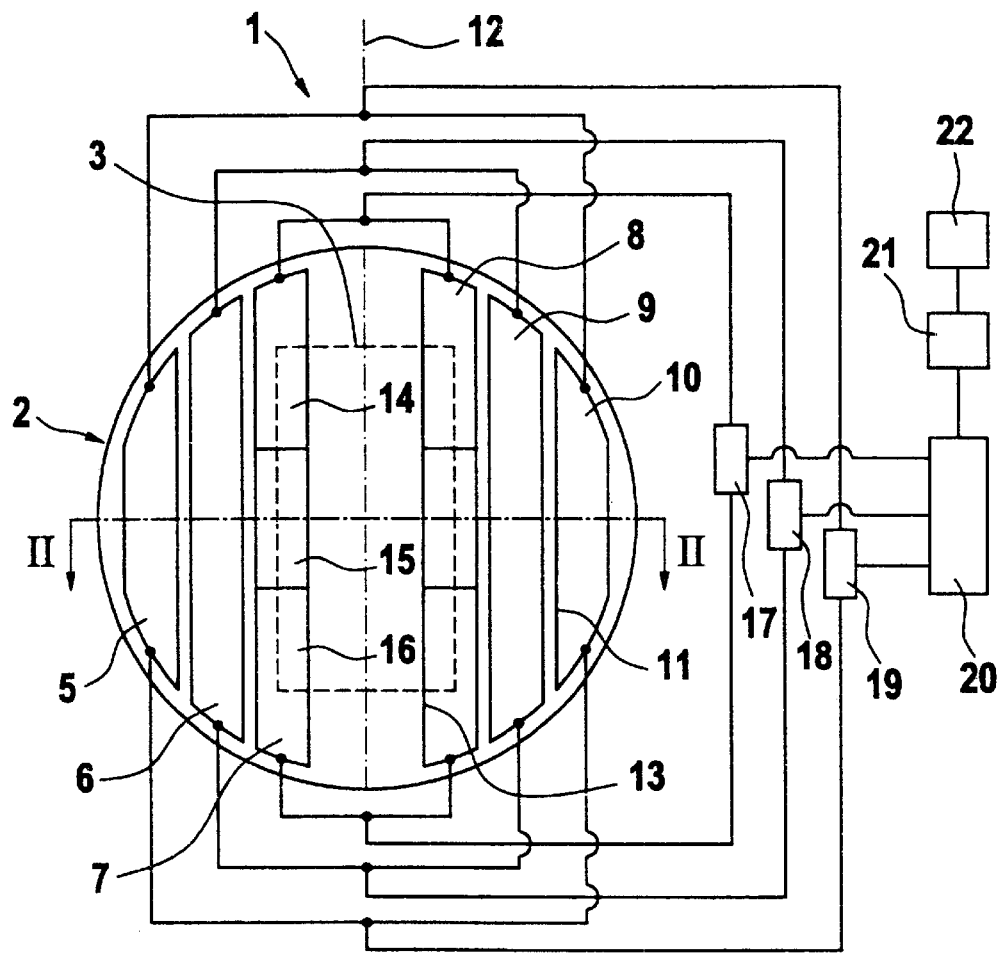
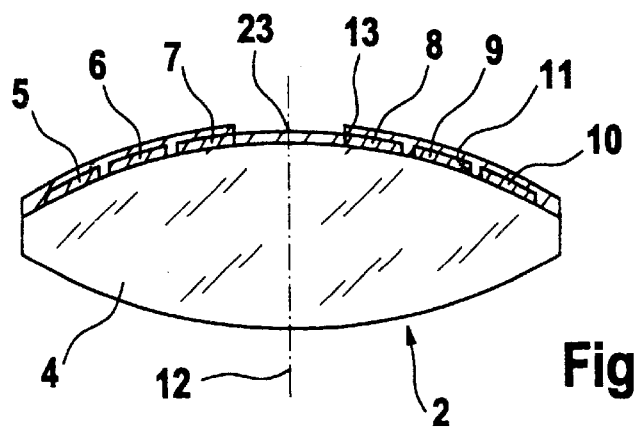
Fig. 1
Fig. 2

OPTICAL ARRANGEMENT HAVING IMPROVED TEMPERATURE DISTRIBUTION WITHIN AN OPTICAL ELEMENT

The invention relates to an optical arrangement, in particular to a microlithographic projection printing installation, in particular having a slot-shaped image field or rotationally non-symmetrical illumination, comprising a light source, which emits radiation, and a refractive optical element, which is heated by being acted upon in a rotationally non-symmetrical manner by the radiation, wherein at least one electric heating element is coupled to the optical element.

The imaging quality of such an optical arrangement is often impaired by rotationally non-symmetrical image defects. Such image defects arise, for example, not only as a result of rotationally non-symmetrical light-induced heating of the optical element but also as a result of other light-induced effects, such as e.g. compaction, which lead to a corresponding, rotationally non-symmetrical expansion and/or refractive index distribution in the optical element.

When high imaging quality is required, as it is in particular for microlithographic projection printing processes, the described light-induced image defects cannot be tolerated. From EP 0 678 768 A2 it is known to seek an improvement of the imaging properties by using additional heating to achieve a symmetrical and/or homogeneous temperature distribution. To said end, a plurality of heating elements are thermally coupled to the peripheral surface of a lens and therefore heat said lens from the direction of its edge.

Such heating of the lens has the drawback that the peripheral surface of the lens has to be heated to a relatively high extent in order, despite the generally poor heat-conducting properties of the lens material, to achieve such a symmetrical and/or homogeneous temperature distribution in the—for the imaging properties—mostly relevant central region of the lens. Intensive heating in the peripheral region of the lens leads however to the risk of the lens and/or lens mounting being damaged by thermal stresses.

Because of the relatively large distance between the peripheral region and the central region of the lens, moreover, a purposeful structured influencing of the temperature distribution in the vicinity of the central region is practically impossible.

The object of the present invention is therefore to develop an optical arrangement of the type described initially in such a way that the temperature distribution in the optical element may be rendered more symmetrical and/or homogeneous.

Said object is achieved according to the invention in that the heating element comprises: a resistance heating coating, which is carried by the optical element and which is substantially optically transparent in the region of the surface of the optical element acted upon by the radiation of the light source and comprises a plurality of parallel, electrically mutually insulated coating strips; as well as a heating current source.

A heating element having coating strips arranged in said manner enables good adaptation of the imaging properties by means of the overall temperature distribution which arises in the lens body on account of the additional heating. In particular, the central region of the lens body and the region surrounding it, the rotationally non-symmetrical heating of which is a primary cause of image defects of the lens as a result of residual absorption of the radiation of the light source, may be directly heated. As the coating strips are optically transparent, they do not needlessly limit the aperture of the lens. Thus, even when the surfaces of the lens body which are to be acted upon by the radiation of the light source change, the same heating element may be used.

The coating strips may form a layer which substantially covers the optical element particularly in the region surrounding the surface acted upon by the radiation of the light source, wherein only narrow gaps remain between the individual coating strips. Such an arrangement of the coating strips enables practically total heating of the lens surface particularly in the region surrounding the surface acted upon by the radiation of the light source. Thus, good control of the imaging properties is possible as a result of the temperature distribution in the optical element being adjustable by means of the heating. The narrow gaps between the coating strips serve as electric insulation between the latter.

The coating strips may carry an anti-reflecting coat at the side remote from the optical element. Said anti-reflecting coat is simultaneously a protective layer for the coating strips. Particularly in the case of coating strips made of a material having a refractive index greater than that of the material used to manufacture the optical element, increased reflection losses may be avoided at the boundary layer of the coating strips remote from the optical element.

The anti-reflecting coat is preferably a continuous layer on the optical element. Thus, for example, both the coating strips and the anti-reflecting coat may be applied in a simple manner by two successive vapour-deposition or other coating operations.

The coating strips are preferentially made of a material which in the region of the wavelength of the radiation has substantially the same refractive index as the material of the optical element. By said means, reflection losses are avoided at the boundary layer between the coating strips and the lens body.

At least two coating strips may have electrical resistances per unit length which differ from one another. With a given heating current, the heat output increases with the heating resistance. Through the preselection of appropriate resistances per unit length it is already possible, given a constant heating current, to achieve a heat output distribution over the lens surface which leads to a good symmetrical and/or homogeneous temperature distribution in the lens body. It is therefore possible to dispense with current control of the heating current.

When the coating strips comprise a plurality of regions of differing electrical resistance per unit length, an additional degree of freedom for adaptation of the heat output distribution over the surface of the lens body is provided, without a variation of the heating current being required for said purpose.

A continuous change of the electrical resistance per unit length may be effected along the coating strips. Such a continuous change leads to a correspondingly continuous variation of the heat energy delivered over the length of the coating strip. Undesirable discontinuities of the temperature distribution are therefore avoided.

In a preferred form of construction, the coating strips are disposed mirror-symmetrically relative to a meridional plane of symmetry, which lies parallel to the coating strips. As a result, given a radiated power distribution of the action by the light source which likewise has a mirror symmetry, the adaptation of the heat output to produce a symmetrical and/or homogeneous temperature distribution is facilitated.

When the coating strips, which are associated with one another mirror-symmetrically by virtue of the meridional plane of symmetry, have identical electrical resistances, manufacture of the heating element is simplified.

In a preferred form of construction of the invention, the heating current source comprises at least two electric supply devices, and the coating strips, which are associated with one another mirror-symmetrically by virtue of the meridional plane of symmetry, are heated by the same electric supply device. This simplifies control of the heating element.

The heating current source may have a communication link to a heating current control circuit, which preselects the outputs to be delivered by the electric supply devices. This enables automatic adaptation of the heat output distribution to the change of external operating parameters of the projecting printing installation.

The heating current control circuit preferentially has a communication link to a sensor, which measures the imaging properties of the optical element and/or optical arrangement, and the preselection of the outputs to be delivered to the electric supply devices is effected in dependence upon the measurement result of the sensor. Such an arrangement enables automatic adaptation of the heat output distribution to optimize the imaging properties of the optical element and/or entire optical arrangement which are acquired by the sensor.

The sensor may be a position-sensitive sensor, which is disposed in a focal plane of the optical element and/or optical arrangement. With such a sensor, precise acquisition of the imaging properties of the optical element and/or optical arrangement is possible.

The position-sensitive sensor may be a CCD detector. Such a sensor has high optical sensitivity and good linearity.

An embodiment of the invention is described in detail below with reference to the drawings; the drawings show:

FIG. 1: a plan view of a heatable lens side according to the invention, wherein the electric supply- and control circuit of the heating is illustrated as a block diagram;

FIG. 2: a section through the heatable lens according to line II—II of FIG. 1.

A heatable lens 1 illustrated in the drawings is part of the optical arrangement of a microlithographic projection printing installation, the other components of which are not shown in the drawings. A lens body 2 is in said case acted upon by a projection light beam of a light source, e.g. the UV emission beam of an argon-fluoride excimer laser. The latter, at the point where it penetrates the lens body 2, presents a rectangular cross-sectional area which is indicated in FIG. 1 by a dashed rectangle 3. Such a printing geometry leads to a slot-shaped image field of the projection printing installation.

The lens body 2 comprises a round, biconvex (cf. FIG. 2) basic body 4, the upward directed surface of which is coated with a total of six resistance strips 5 to 10. The basic body 4 is made of a highly transparent material for the projection light beam, in the case of a UV emission beam, of quartz glass or $CaF_2$.

The resistance strips 5 to 10 are disposed parallel to one another in two groups each comprising three resistance strips 5, 6, 7 and 8, 9, 10, wherein a narrow insulating gap 11 remains between each of the individual resistance strips within a group (5, 6, 7 or 8, 9, 10).

The two groups of resistance strips 5, 6, 7 and 8, 9, 10 are disposed symmetrically relative to a meridional plane 12 of the lens body 2 extending parallel between them. A gap 13, which is larger than the insulating gaps 11 and in which the basic body 4 has no heating coat, remains between the resistance strips 7, 8 adjacent to the meridional plane 12.

The resistance strips 5 to 10 are made of an electrically conductive medium which, for the wavelength of the light source (in the case of the argon-fluoride excimer laser, 193.3 nm), is optically transparent practically without loss. Their longitudinal extension is limited by the round shape of the lens body 2, with the result that the innermost resistance strips 7, 8 are the longest and the outermost resistance strips 5, 19 are the shortest.

The two innermost resistance strips 7, 8 are subdivided at right angles to their longitudinal extension in each case into three resistance zones 14 to 16. The central resistance zone 15, compared to the outer resistance zones 14 and 16 surrounding it, has a lower electrical resistance per unit length along the resistance strips 7 and 8.

The lower resistance per unit length of the resistance zones 14 and 16, compared to the resistance zone 15, is achieved in that the layer thickness of the resistance strip 7 in the resistance zone 15 is less than in the resistance zones 14 and 16. Alternatively, this may be achieved by a suitable selection of material in the resistance zones 14 to 16, e.g. by a stronger doping with a conductive material in the resistance zones 14 and 16 than in the resistance zone 15. The resistance per unit length of the resistance strips 5, 6 and 9, 10 corresponds to that of the resistance zones 14, 16.

The described arrangement of the resistance strips 5 to 10 relative to the meridional plane 12 gives rise to three pairs 7, 8; 6, 9; 5, 10 of resistance strips, each of which comprises two resistance strips disposed symmetrically relative to one another. The resistance strips 5 to 10, at their narrow sides adjacent to the edge of the lens body 2, have contact points, via which electric lines are connected to the resistance strips 5 to 10. The pairs 7, 8; 6, 9; 5, 10 are electrically connected in parallel. Each pair 7, 8; 6, 9; 5, 10 is connected to a separate power supply unit 17, 18, 19. The latter supplies electrical energy to the appropriate resistance strips 5 to 10 for heating purposes.

The electrical power output of the power supply units 17 to 19 is controlled by a heating current control circuit 20, which has a communication link to said power supply units. The setpoint output for the power supply units 17 to 19 is entered into the heating current control circuit 20 by a printing control circuit 21, which has a communication link to the heating current control circuit 20. Connected in turn to the printing control circuit 21 is a two-dimensional CCD array 22, onto which a focal plane of the optical arrangement of the projection printing installation is imaged by means of a suitable optical element (not shown).

From FIG. 2 it is evident that the basic body 4 of the lens body 2, at the side on which it carries the resistance strips 5 to 10, is coated with an anti-reflecting coat 23. The latter, above all as far as its thickness above the resistance strips 5 to 10 and in the region of the insulating gaps 11 and the gap 13 is concerned, is only diagrammatically illustrated.

The side of the lens body 2 remote from the resistance strips 5 to 10 also carries an anti-reflecting coat (not shown).

The heatable lens operates as follows:

The projection light beam heats the lens body 2 on account of the residual absorption which the material of the lens body 2 presents in the region of the wavelength of the projection light beam. Said heating initially has the symmetry of the light channel of the projection light beam in the lens body 2. The heating leads both to thermal expansion of the material as well as to a change of refractive index and hence to a change of the imaging properties of the lens body 2.

The purpose of heating the lens body 2 by means of the resistance strips 5 to 10 is to make the temperature distribution in the lens body 2 symmetrical or achieve a preset shape of said temperature distribution. The resulting defined distribution of the thermal expansion as well as the spatially constant refractive index in the lens body 2 lead to controllable imaging properties.

In a first step, the heating current control circuit 20 is used to control the power output by the power supply units 17 to 19 to the resistance strips 5 to 10 in such a way that the latter heat the lens body 2, in particular the basic body 4, predominantly at points where no heating by the projection light beam occurs. Said points, in the situation shown in FIG. 1, in which the cross-sectional area 3 of the projection light beam partially penetrates only the resistance strips 7, 8, are the resistance strips 5, 6 and 9, 10.

The combined heating of the lens body 2 by the action of the projection light beam, on the one hand, and the electric heating of the resistance strips 5, 6, 9, 10, on the other hand, leads to a temperature distribution in the lens body 2 which comes closer to a rotational symmetry about the optical axis than in the case of an unheated lens body 2, which is heated only by the residual absorption of the projection light beam. Said improved symmetrical distribution of temperature leads to a reduction of image defects of the lens body 2. Said reduced image defects lead to improved imaging of the projection printing installation, which in turn is acquired by the CCD array 22 and evaluated with the aid of the printing control circuit 21 by means of known image acquisition algorithms.

Through comparison of the structure, which is acquired by the CCD array 22 and instantaneously imaged by means of the projection printing installation, with a setpoint structure entered into the printing control circuit 21, the printing control circuit 21 determines new setpoint values for the power output of the power supply units 17 to 19, which are passed on to the heating current control circuit 20 for control of the power supply units 17 to 19. Thus, as a result of the surface-selective heating of the heatable lens 1 the imaging quality of the optical arrangement iteratively approaches an optimum with minimum imaging defects.

Depending on the focal plane monitored by the CCD array 22 an optimization of imaging properties of the lens 1 alone or of a lens group, to which the lens 1 belongs, e.g. a projection lens system, is possible. In the last two cases, an over-compensation of imaging defects is effected in that the one heatable lens 1 is heated in such a way that the resulting imaging properties of the lens 1 just compensate the imaging defects of the remaining lenses of a lens group.

When in the course of said iterative process heating current is applied by the power supply unit 17 also to the heating strips 7, 8, the lower resistance per unit length of the middle resistance zones 15 compared to the adjacent resistance zones 14, 16 ensures that the region of the lens body 2, which is adjacent to the optical axis and heated most by the projection light beam, which is generally at its most intense there, does not additionally experience more intensive heating by the resistance heating.

The arrangement of the resistance zones 14 to 16 in FIG. 1 is merely by way of example. In practice, the resistance strips 5 to 10 may be alternatively disposed on both sides of the lens body 2 or also subdivided into a plurality of resistance zones of differing heating resistance. In said case, by way of adaptation of the heating output to the geometry of the light impingement both the absolute resistances as well as the resistances per unit length of the resistance strips 5 to 10 may differ from one another. The changes of resistance per unit length between the individual resistance zones do not have to be abrupt but may instead be fluid.

By virtue of the resistance heating described above, not only is a compensation of imaging defects due to residual absorption possible but also other imaging defects, e.g. astigmatism or defects caused by material irregularities in the optical elements, may be compensated by appropriate heating via resistance strips.

What is claimed is:

1. An optical arrangement comprising a light source, which emits radiation, and a refractive optical element, which is heated by being acted upon in a rotationally non-symmetrical manner by the radiation, wherein at least one electric heating element is coupled to the optical element, wherein the heating element comprises: a resistance heating coating, which is carried by the optical element (4) and which is substantially optically transparent in the region of the surface (3) of the optical element (4) acted upon by the radiation of the light source and comprises a plurality of parallel, electrically and mutually insulated coating strips (5 to 10); as well as a heating current source (17 to 19).

2. An optical arrangement as claimed in claim 1, wherein the coating strips (5 to 10) form a layer which substantially covers the optical element (4) at least in the region surrounding the surface (3) acted upon by the radiation of the light source, wherein only narrow gaps (11) remain between the individual coating strips (5 to 10).

3. An optical arrangement as claimed in claim 1, wherein the coating strips (5 to 10) carry an anti-reflecting coat (23) at the side remote from the optical element (4).

4. An optical arrangement as claimed in claim 3, wherein the anti-reflecting coat (23) is a continuous coat on the optical element (4).

5. An optical arrangement as claimed in claim 1, wherein the coating strips (5 to 10) are made of a material, which in the region of the wavelength of the radiation has substantially the same refractive index as the material of the optical element (4).

6. An optical arrangement as claimed in claim 1, wherein at least two coating strips (5 to 10) have electrical resistances per unit length which differ from one another.

7. An optical arrangement as claimed in claim 1, wherein the coating strips (7, 8) comprise a plurality of zones (14, 15, 16) of differing electrical resistance per unit length.

8. An optical arrangement as claimed in claim 7, wherein a continuous change of the electrical resistance per unit length is effected between the zones (14, 15, 16) along the coating strips (7, 8).

9. An optical arrangement as claimed in claim 1, wherein the coating strips (5 to 10) are disposed mirror-symmetrically relative to a meridional plane of symmetry (12), which lies parallel to the coating strips (5 to 10).

10. An optical arrangement as claimed in claim 9, wherein the coating strips (7, 8; 6, 9; 5, 10) associated mirror-symmetrically with one another as a result of the meridional plane of symmetry (12) have identical electrical resistances.

11. An optical arrangement as claimed in claim 1, wherein the heating current source comprises at least two electric supply devices (17 to 19) and wherein the coating strips (7, 8; 6, 9; 5, 10) associated mirror-symmetrically with one another as a result of the meridional plane of symmetry (12) are heated by the same electric supply device (17; 18; 19).

12. An optical arrangement as claimed in claim 1, wherein the heating current source (17 to 19) has a communication link to a heating current control circuit (20), which preselects the outputs to be delivered by the electric supply devices (17; 18; 19).

13. An optical arrangement as claimed in claim 12, wherein the heating current control circuit (20, 21) has a communication link to a sensor (22), which measures the imaging properties of the optical element (4) and/or optical arrangement, and the preselection of the outputs to be delivered by the electric supply devices (17, 18, 19) is effected in dependence upon the measurement result of the sensor (22).

14. An optical arrangement as claimed in claim 13, wherein the sensor (22) is a position-sensitive sensor, which is disposed in a focal plane of the optical element (4) and/or optical arrangement.

15. An optical arrangement as claimed in claim 14, wherein the position-sensitive sensor (22) is a CCD detector.

16. The invention according to claim 1, wherein the optical arrangement comprises a microlithographic projection printing installation.

17. The invention according to claim 1, wherein the image field is at least one of slot shaped or rotationally non-symmetrical illumination.

* * * * *